US005688707A

United States Patent [19]

Lee et al.

[11] Patent Number: 5,688,707

[45] Date of Patent: Nov. 18, 1997

[54] METHOD FOR MANUFACTURING FIELD EMITTER ARRAYS

[75] Inventors: Jong Duk Lee, Department of Electronics Engineering, College of Engineering, Seoul National University, Shin Lim-dong, Kwanak-ku; Hyung Soo Uh, both of Seoul, Rep. of Korea

[73] Assignees: Korea Information & Communication Co., Ltd.; Jong Duk Lee, both of Seoul, Rep. of Korea

[21] Appl. No.: 661,458

[22] Filed: Jun. 11, 1996

[30] Foreign Application Priority Data

Jun. 12, 1995 [KR] Rep. of Korea .................. 1995-15449

[51] Int. Cl.$^6$ .................................................. H01L 21/465

[52] U.S. Cl. ............................ 437/51; 437/228; 437/916

[58] Field of Search ............................... 437/48, 51, 228, 437/916; 148/DIG. 172

[56] References Cited

U.S. PATENT DOCUMENTS 5,266,530 11/1993 Bagley et al. .......................... 437/228
5,455,196 10/1995 Frazier .................................. 437/916
5,532,177 7/1996 Cathey .................................. 437/916

OTHER PUBLICATIONS

Uh, et al., "New fabrication method of silicon field emitter arrays using thermal oxidation", J. Vac. Sci. Technol. B 13(2), Mar./Apr. 1995, pp. 456–460.

Uh, et al., "Fabrication and Characterization of Gated n+ Polycrystalline Silicon Field Emitter Arrays", 9th International Vacuum Microelectronics Conference, St. Petersburg 1996, pp. 419–422.

*Primary Examiner*—Chandra Chaudhari
*Attorney, Agent, or Firm*—Dilworth & Barrese

[57] ABSTRACT

The present invention provides a method for manufacturing field emitter arrays, comprising steps of forming a $n^+$-layer in a polycrystalline or amorphous silicon layer deposited on an insulating substrate, making an oxide layer disk pattern on said silicon layer, etching said silicon layer isotropically, forming a silicon oxide layer on the upper part of said silicon layer by means of the first oxidation, which results in field emitter tips, making hollows, depositing a silicon nitride layer with a predetermined thickness on said silicon oxide layer, removing said silicon nitride layer except that of the side-wall parts around said field emitter tips, forming a gate insulating layer by means of the second oxidation, removing said silicon nitride layer of said sidewall parts around said tips, making contact window, and forming gate electrodes and cathode contacts by depositing gate metal on said gate insulating layers. According to the present invention, field emitter arrays can be formed uniformly over a large area with pixels insulated therebetween.

10 Claims, 3 Drawing Sheets

METHOD FOR MANUFACTURING FIELD EMITTER ARRAYS

BACKGROUND OF THE INVENTION

The present invention relates to a method for manufacturing field emitter arrays, and more particularly, to a method for manufacturing field emitter arrays formed uniformly over a large area and with pixels therebetween insulated by etching polycrystalline or amorphous silicon layer deposited on an insulating substrate.

Generally, a field emission display (FED), as a kind of flat panel display, is made of the field emitter arrays as its main elements, and how to form the field emitter arrays uniformly over a large area holds the key to the practical application of the field emitter arrays to the FED.

The prior arts to which the invention is directed include a method for manufacturing a silicon-field emitter array (Si-FEA) by thermal oxidation of silicon (Korean Laid-open Patent Application No. 95-9786). In the conventional method such as the above mentioned, it was hard to form Si-FEAs uniformly over a large FED panel since a single-crystalline silicon substrate was used as a substrate for manufacturing field emitter arrays.

Also, high doping concentration of the substrate between the wells formed for junction isolation, that is, insulation between neighboring two pixels, may cause junction breakdown at lower voltages than the operating voltage.

SUMMARY OF THE INVENTION

It is, therefore, an object of the present invention to provide a method for manufacturing field emitter arrays formed uniformly and reproducibly over a large area with neighboring pixels insulated therebetween.

To accomplish the foregoing object of the present invention, there is provided a method for manufacturing field emitter arrays, comprising the steps:

forming a $n^+$-layer in a polycrystalline or amorphous silicon layer deposited on an insulating substrate; making an oxide layer disk pattern on the silicon layer; etching the silicon layer isotropically using the oxide layer disk pattern as a mask; forming a silicon oxide layer on the upper part of the silicon layer by means of the first oxidation thereof, which results in cone-shaped field emitter tips; making hollows for insulating pixels from neighboring ones by etching the oxide layer; depositing a silicon nitride layer with a predetermined thickness on the silicon oxide layer; removing the silicon nitride layer except that of the sidewall parts around the field emitter tips; forming a gate insulating layer by means of the second oxidation; removing the silicon nitride layer of the sidewall parts around the tips; making contact window by removing the silicon oxide layer for cathode contact with a external driving circuit; depositing gate metal on the gate insulating layers to form gate electrode and cathode contact simultaneously; etching away the oxide layers around the field emitter tips and the metal deposited thereon; and patterning gate electrode and cathode contact by removing unnecessary parts of the gate metal.

BRIEF DESCRIPTION OF THE DRAWINGS

The above object and other advantages of the present invention will become more apparent by the following detailed description of preferred embodiments thereof with reference to the attached drawings in which.

DETAILED DESCRIPTION OF THE INVENTION

Hereinafter, the present invention will be described in detail with reference to the accompanying drawings and in comparison with the conventional method.

The conventional method for manufacturing a Si-FEA is shown in FIG. 1.

Figure 1A:
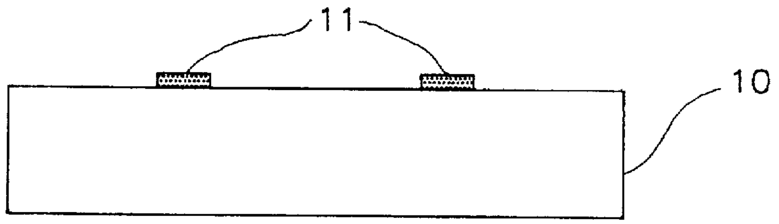
FIGS. 1A–1E are cross-sectional views showing the steps of manufacturing a field emitter array by a conventional method.

First, a doped silicon substrate 10, which is to function as the cathode electrodes of a field emitter array to be made, is thermally oxidized and a minute oxide layer disk pattern 11 is formed thereon by using the photolithography technique [FIG. 1A].

Figure 1B:
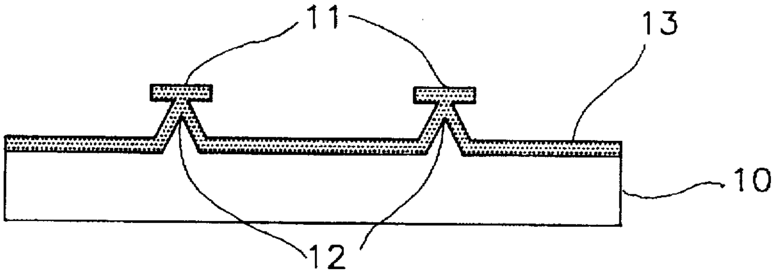

After the silicon substrate 10 is isotropically etched, a silicon oxide layer 13 is then formed thereon by means of the first oxidation, resulting in cone shaped field emitter tips 12 as shown in FIG. 1B.

Figure 1C:
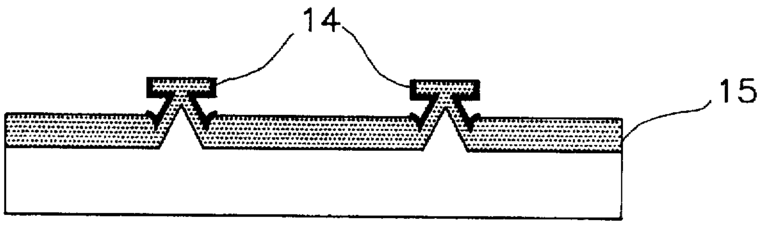

Next, a silicon nitride layer 14 is formed on the silicon oxide layer 13 by the LPCVD method and then removed except that of sidewall parts around the field emitter tips by dry-etching method, and a gate insulating layer 15 is formed by means of the second oxidation [FIG. 1C]. At this stage, the sidewall part of the silicon nitride layer 14 may have a role to protect the apex of the tip 12 from being dulled during the second oxidation.

Figure 1D:
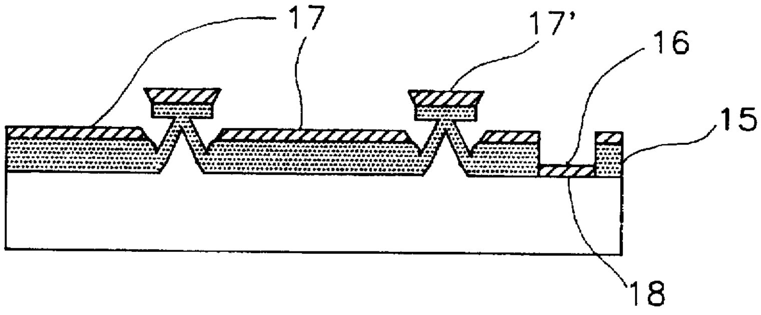

Thereafter, as shown in FIG. 1D, the silicon nitride layer 14 of the sidewall part is removed and contact window 16 is formed by removing the part of the oxide layer for the cathode contact with a external driving circuit. Gate electrodes 17 and cathode contacts 18 are then formed by depositing gate metal onto the gate insulating layer 15 by using an electron beam evaporator.

Figure 1E:
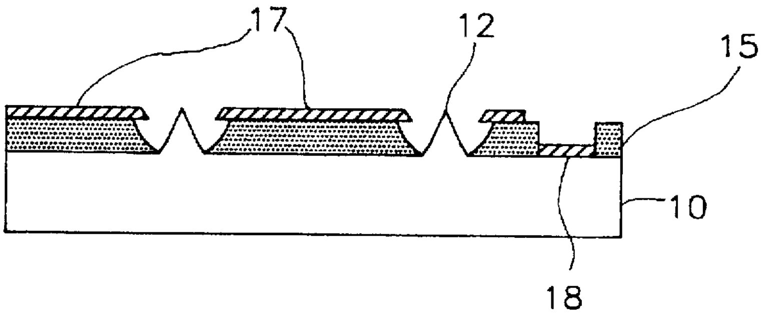

Next, the oxide layer around the field emitter tips 12 is etched away with the metal 17' deposited thereon by a wet-etching lift-off process and finally through a gate patterning obtained is the shape of the element shown in cross section in FIG. 1E.

EMBODIMENT 1

FIG. 2A–FIG. 2F are cross-sectional views showing the steps of manufacturing a field emitter array according to the first embodiment of the present invention.

A polycrystalline or amorphous silicon layer 21 is deposited to a reasonable thickness, for example 1–2 μm, on an insulating substrate 20 made of vycor, which is a kind of glass and has a melting point more than 900° C., by the LPCVD method or the APCVD method. In this step, prior to depositing polycrystalline or amorphous silicon on the insulating substrate, formation of a conductive layer such as a metal layer may decrease the resistance of cathode electrodes.

Figure 2A:
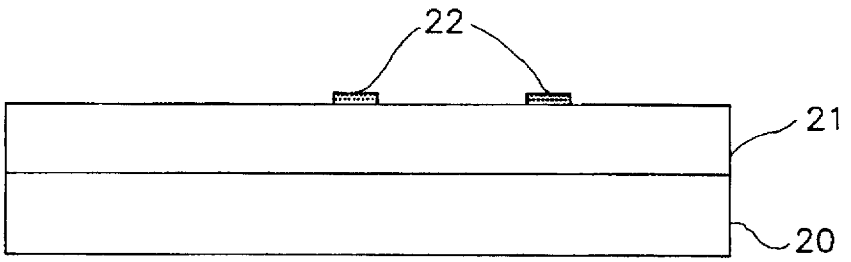
FIGS. 2A–2F are cross-sectional views showing the steps of manufacturing a field emitter array according to the first embodiment of the present invention.

In order to use the silicon layer 21 as the cathode electrode, a $n^+$-layer as the cathode electrode is then formed by the methods such as $POCl_3$ doping on the silicon layer and then, an oxide layer is deposited thereon by using the CVD method or formed by means of thermal oxidation and a minute oxide layer disk pattern 22 as shown in FIG. 2A is formed thereon by using the lithography technique.

Figure 2B:
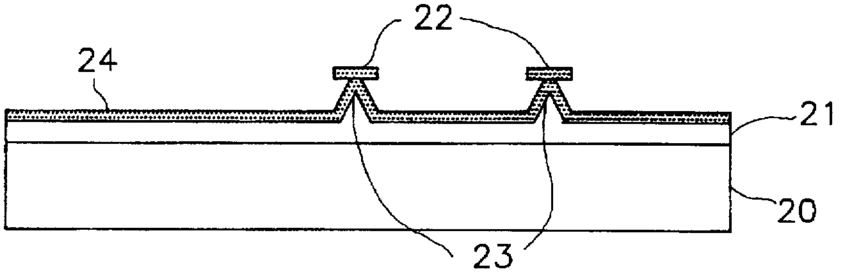

After the silicon layer 21 is isotropically etched using the oxide layer disk pattern as a mask, a silicon oxide layer 24 is then formed on the upper part of the silicon layer 21 by means of the first oxidation thereof, resulting in cone shaped field emitter tips 23 as shown in FIG. 2B.

Figure 2C:
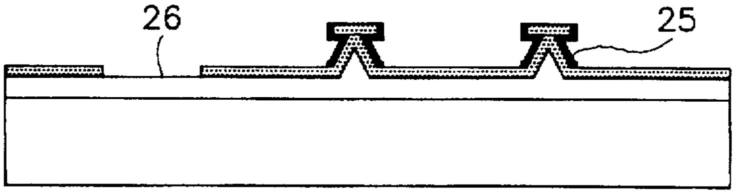

Continuously, as shown in FIG. 2C, a silicon nitride layer 25 is formed on the silicon oxide layer 24 by the LPCVD method and then the silicon nitride is removed except that of the sidewall parts around the field emitter tips by dry-etching method. Also, hollows 26 are formed by removing the oxide between one pixel and another to insulate pixels from neighboring ones in applying the field emitter arrays to the FED.

A gate insulating layer 27 is then formed by means of the second oxidation, and at this stage the sidewall parts of the silicon nitride layer 25 may have a role to protect the apex of the field emitter tips 23 from being oxidized, thus the apex of the tips 23 are kept sharp.

Further, because of the hollows formed in the second oxidation step as shown in FIG. 2C, the silicon under the hollows 26 is to be consumed more than in other parts in the second oxidation, that is, the cathode electrodes under the hollows 26 are all oxidized, but not the cathode electrodes under the pixels, and the complete insulation between one pixel and another is possible.

Figure 2D:
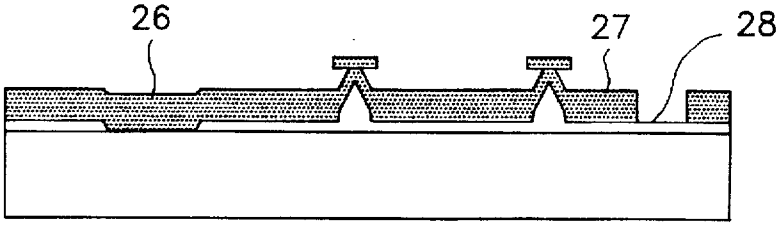
Figure 2E:
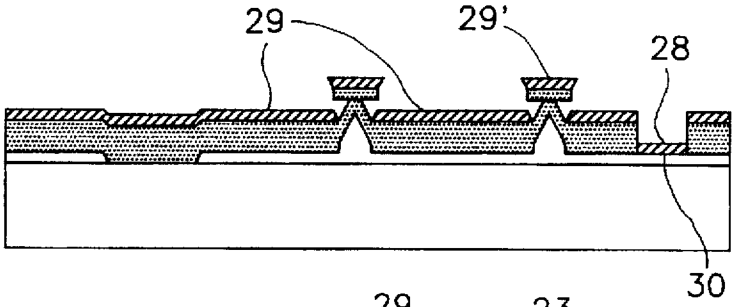

Next, the silicon nitride layers 25 of the sidewall parts are then removed and a part of the silicon oxide layer is removed to form contact window 28 as shown in FIG. 2D. Therefore, it is possible to form the cathode contact with an external driving circuit through the contact window. Gate metal is then deposited on the gate insulating layers 27 by using an electron beam evaporator, and consequently gate electrodes 29 and cathode contacts 30 are formed [FIG. 2E].

Figure 2F:
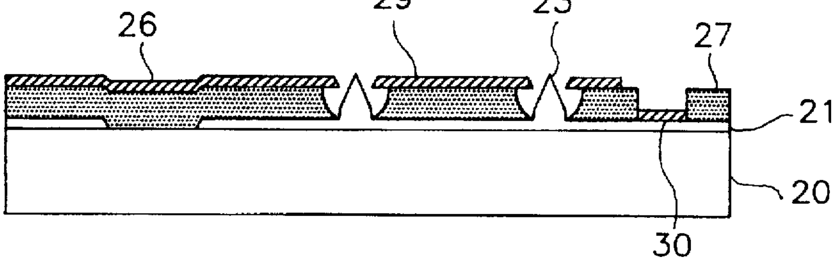

Then, the oxide layers around the field emitter tips 23 and the metal 29' deposited thereon are etched away by a wet-etching lift-off process, and finally through a gate patterning formed is the shape of the field emitter arrays shown in cross section in FIG. 2F.

EMBODIMENT 2

FIG. 3A–FIG. 3F are cross-sectional views showing method for manufacturing field emitter arrays by using directly a ceramic as an insulating substrate to insulate pixels from neighboring ones according to the second embodiment of the present invention.

Figure 3A:
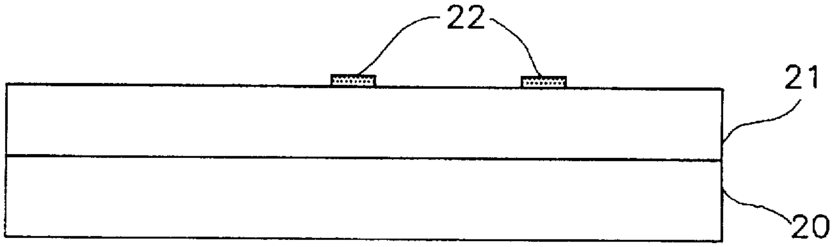
FIGS. 3A–3F are cross-sectional views showing the steps of manufacturing a field emitter array according to the second embodiment of the present invention.
Figure 3B:
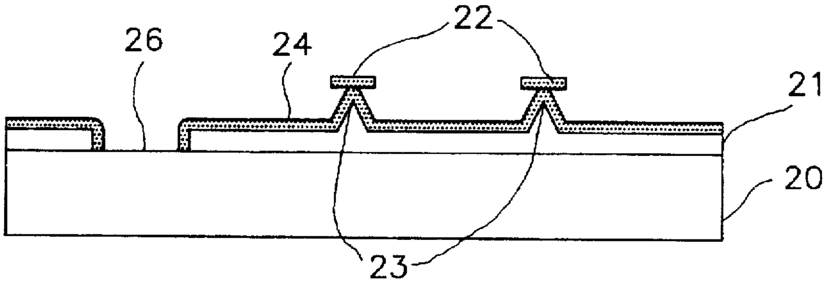

After the shape shown in cross section in FIG. 3A, is obtained by the same step as shown in FIG. 2A, the silicon layer 21 between one pixel and another is isotropically etched and and then, hollows 26 are formed. In this step, the removal of the silicon layer 21 functioning as the cathode electrode in the hollows 26 enables pixels to be completely insulated from neighboring ones. Cone shaped field emitter tips 23 as shown in FIG. 3B are made by means of the first oxidation.

Figure 3C:
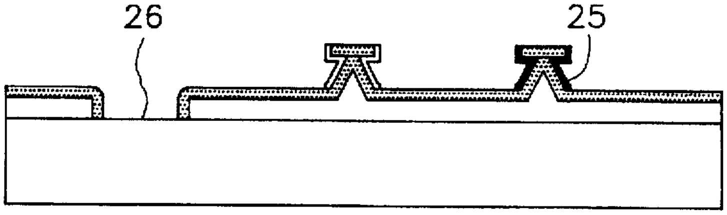
Figure 3D:
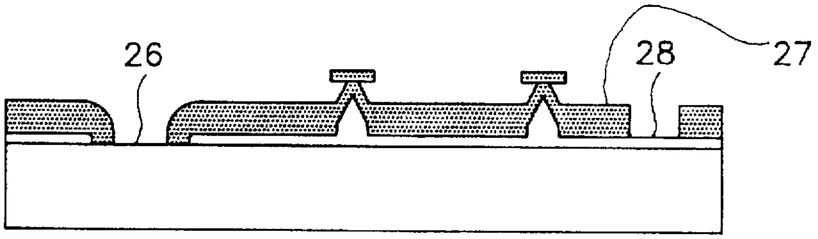
Figure 3E:
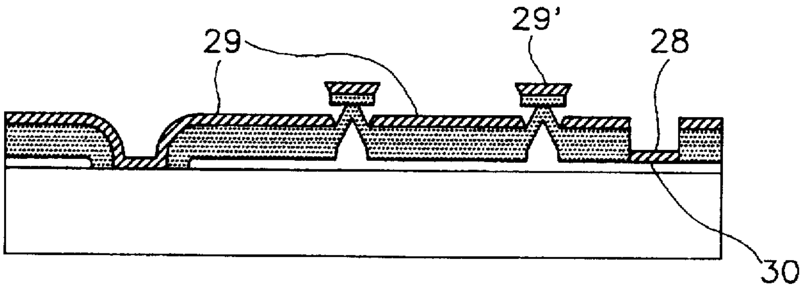

Next, as shown in FIG. 3C, the silicon nitride layer 25 is formed by the LPCVD method on the silicon oxide layer 24 and then the silicon nitride layer 25 is removed except that of the sidewall parts around the field emitter tips by dry-etching method.

Further, a gate insulating layer 27 is formed by means of the second oxidation. At this stage, the sidewall parts of the silicon nitride layers 25 may have a role to protect the apex of the field emitter tips 23 from being dulled.

Figure 3F:
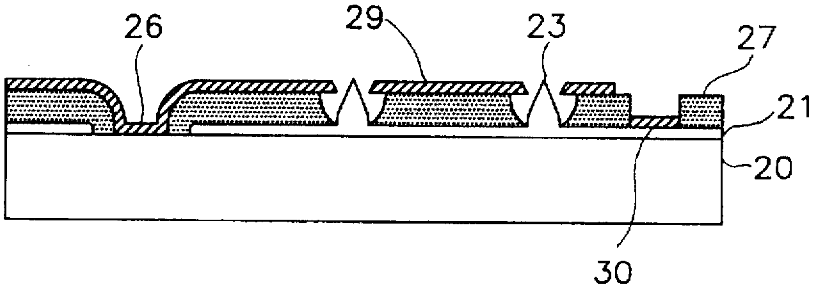

The detailed description of the following steps will be omitted since the removal step of the silicon nitride layers 25 and the following steps are carried out as in the first embodiment, thus finally formed is the shade shown in cross section in FIG. 3F.

According to the present invention, field emitter arrays are manufactured by using polycrystalline or amorphous silicon layer deposited on the insulating substrate instead of using a single crystalline silicon substrate, and consequently a large FED panel, for example, the high resolution FED panel with 1,000×1,000 pixels, can be made. Also, field emitter arrays may be used in a monitor for notebook computer and a existing CRT display, and find special applications to large displays of projection or headmount displays and others.

The vycor, which is a kind of glass and has a high melting point, and the ceramic are used as the insulating substrate in the above embodiments, however, the other plate glass with the melting point more than 1,000° C. or the quartz plate may be used as the insulating substrate.

And, an ordinary plate glass with a low melting point may be used as the insulating substrate in other experiment for applying the present invention, which proved that production cost could be reduced. In this experiment, instead of forming the insulating layer by means of thermal oxidation of the silicon layer, which is formed by depositing polycrystalline or amorphous silicon on the ordinary plate glass by means of the PECVD method, it was also possible to manufacture the same field emitter arrays as those obtained in the first and second embodiment by using the techniques such as the thermal oxidation at low temperature and under high pressure. The thermal oxidation at low temperature with using ECR plasma, or anodization of silicon in HF solution to form porous silicon and thermal oxidation of the resulting porous silicon at low temperature.

The present invention has been described as for examples, with respect to the preferred embodiments and variations and modifications may be made by one skilled in the art within the scope of the teaching of the present invention. It may be understood that the present invention is not limited by the specific embodiment herein, but shall be limited only by the claims.

What is claimed is:

1. A method for manufacturing field emitter arrays, comprising the steps of;

forming a $n^+$-layer in a polycrystalline or amorphous silicon layer deposited on an insulating substrate;

making an oxide layer disk pattern on said silicon layer;

etching said silicon layer isotropically using said oxide layer disk pattern as a mask;

forming a silicon oxide layer on the upper part of said silicon layer by means of the first oxidation thereof, which results in cone-shaped field emitter tips;

making hollows for insulating pixels from neighboring ones;

depositing a silicon nitride layer with a predetermined thickness on said silicon oxide layer;

removing said silicon nitride layer except that of the side-wall parts around said field emitter tips;

forming a gate insulating layer by means of the second oxidation;

removing said silicon nitride layer of said sidewall parts around said tips;

making contact window by removing the parts of said silicon oxide layer for cathode contact with an external driving circuit;

depositing gate metal on said gate insulating layers to form gate electrode and cathode contact simultaneously;

etching away said oxide layers around said field emitter tips and said metal deposited thereon; and, patterning gate electrode and cathode contact by removing unnecessary parts of said gate metal.

2. A method for manufacturing field emitter arrays as claimed in claim 1, wherein said hollows are made by removing specific parts of said silicon oxide layer, after said silicon layer is isotropically etched and said field emitter tips are formed by means of the first oxidation.

3. A method for manufacturing field emitter arrays as claimed in claim 1, wherein said hollows are made by removing specific parts of said silicon layer, after said silicon layer is isotropically etched.

4. A method for manufacturing field emitter arrays as claimed in claim 1, wherein said insulating substrate is made of a glass with the melting point more than 1,000° C., a ceramic or a quartz plate, on which polycrystalline or amorphous silicon layer is deposited and oxidized by means of thermal oxidation at high temperature.

5. A method for manufacturing field emitter arrays as claimed in claim 1, wherein said insulating substrate is made of an ordinary glass plate, on which polycrystalline or amorphous silicon layer is deposited and oxidized by means of thermal oxidation at low temperature and under high pressure, thermal oxidation at low temperature with using ECR plasma, or anodization of silicon in HF solution to form porous silicon and thermal oxidation of the resulting porous silicon at low temperature.

6. A method for manufacturing field emitter arrays as claimed in claim 1, wherein said silicon layer is formed by the LPCVD method.

7. A method for manufacturing field emitter arrays as claimed in claim 1 wherein said silicon layer is formed by the PECVD method.

8. A method for manufacturing field emitter arrays as claimed in claim 1, wherein said silicon layer is formed on a metal layer deposited on said insulating substrate.

9. A method for manufacturing field emitter arrays as claimed in claim 4, wherein said silicon layer is formed by the LPCVD method.

10. A method for manufacturing field emitter arrays as claimed in claim 5, wherein said silicon layer is formed by the PECVD method.

* * * * *